United States Patent [19]
Hertz et al.

[11] Patent Number: 6,033,493
[45] Date of Patent: Mar. 7, 2000

[54] PROCESS FOR COATING A PASSIVATABLE METAL OR ALLOY SUBSTRATE WITH AN OXIDE LAYER, AND FUEL ASSEMBLY CLADDING AND GUIDE TUBES AND SPACER GRID COATED WITH AN OXIDE LAYER

[75] Inventors: Dominique Hertz, Saint-Foy-les-Lyon; Thierry Belmonte, Villers les Nancy; Jérôme Gavillet, Nancy; Henri Michel, Vandoeuvre les Nancy, all of France

[73] Assignees: Framatome, Courbevoie; Cogema Velizy, Villacoublay, both of France

[21] Appl. No.: 08/849,408

[22] PCT Filed: Nov. 29, 1995

[86] PCT No.: PCT/FR95/01576

§ 371 Date: Oct. 28, 1997

§ 102(e) Date: Oct. 28, 1997

[87] PCT Pub. No.: WO96/17105

PCT Pub. Date: Jun. 6, 1996

[30] Foreign Application Priority Data

Dec. 1, 1994 [FR] France .................................. 94 14466

[51] Int. Cl.⁷ .................................................. C23C 28/00
[52] U.S. Cl. .......................... 148/276; 148/277; 148/281; 148/283; 148/284; 428/472.1; 427/539; 427/253; 376/438; 376/353; 376/457; 376/305; 204/157.43
[58] Field of Search ................................. 148/276, 277, 148/280, 281, 283, 284; 428/472.1; 427/6, 539, 253; 376/353, 438, 457, 305; 204/157.44, 157.43, 157.51

[56] References Cited

U.S. PATENT DOCUMENTS

| | | | |
|---|---|---|---|
| 4,239,819 | 12/1980 | Holzl | 427/255.2 |
| 5,238,524 | 8/1993 | Hertz | 148/281 |

FOREIGN PATENT DOCUMENTS

| | | |
|---|---|---|
| 0 022 349 A1 | 1/1981 | European Pat. Off. . |
| 0275978 A2 | 7/1988 | European Pat. Off. . |
| 2532664 | 3/1984 | France . |

OTHER PUBLICATIONS

Kumashiro et al., Low Temperature Preparation of $TiO_2$ Thin Films by Plasma–Enhanced Chemical Vapor Deposition, Journal of the Ceramic Society of Japan, 1993, No. 5.

Cao et al. Research on YSZ thin films prepared by plasma–CVD process, Elsevier Science S.A., 1994, pp. 163–167.

Choi et al., Effects of the reaction parameters on the deposition characteristics in $ZrO_2$ CVD, Journal of Materials Science: Materials in Electronics, Jun. 1992, vol. 3, No. 2, pp. 87–92.

Yasuda et al., Low–temperature preparation of $SiO_2/Si(100)$ interfaces using a two-step remote plasma–assisted oxidation–deposition process, Applied Physics Letters, 1992, vol. 60, No. 4, pp. 434–436.

Cao et al., Research on YSZ thin films prepared by plasma–CVD process, Elsevier Science S.A., 1994, pp. 163–167.

*Primary Examiner*—John Sheehan
*Assistant Examiner*—Andrew L. Oltmans
*Attorney, Agent, or Firm*—Pollock, Vande Sande & Amernick

[57] ABSTRACT

Surface preoxidation of the substrate is carried out by bringing the substrate into contact with an oxidizing gas excited by a cold plasma, the substrate being situated in the flowing afterglow of the cold plasma used to excite the oxidizing element and being heated to an oxidation temperature of less than 500° C. A metal oxide is formed at the surface of the preoxidized substrate by heterogeneous oxidation of a metal halide with a gas mixture including an oxidizing element activated by a cold plasma. The oxidizing gas mixture is brought into contact with the halide as directly as possible in the vicinity of the substrate arranged in the far flowing afterglow of the cold plasma. The cold plasma is preferably generated by microwaves. The process can be used in particular for producing a protective coating on a cladding tube of a nuclear fuel rod.

15 Claims, 1 Drawing Sheet

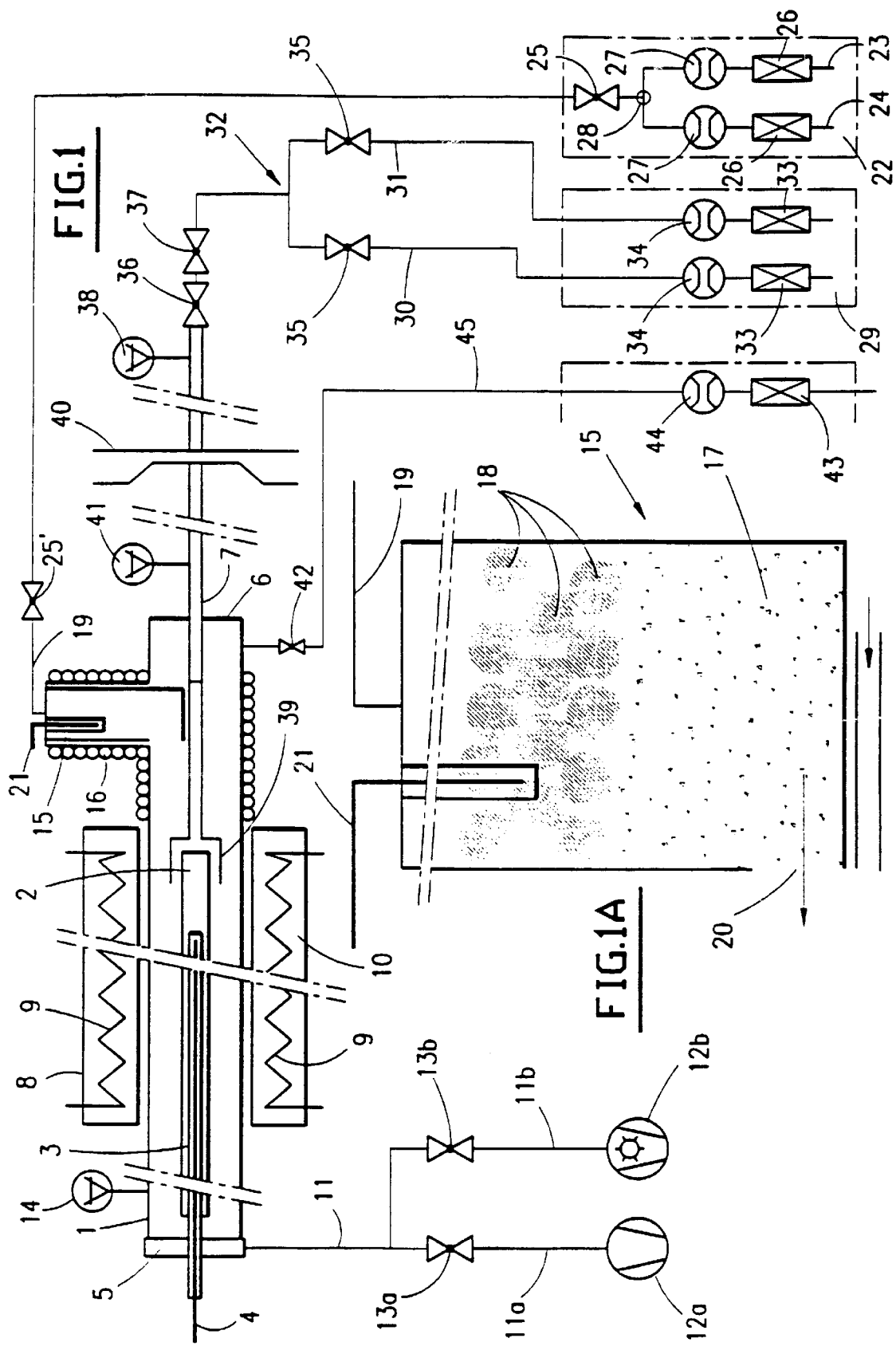

PROCESS FOR COATING A PASSIVATABLE METAL OR ALLOY SUBSTRATE WITH AN OXIDE LAYER, AND FUEL ASSEMBLY CLADDING AND GUIDE TUBES AND SPACER GRID COATED WITH AN OXIDE LAYER

FIELD OF THE INVENTION

The invention relates to a process for coating a substrate made of a passivatable metal or an alloy based on a passivatable metal, such as zirconium, with a metal oxide layer.

BACKGROUND OF THE INVENTION

Fuel rods of pressurized water nuclear reactors consist of pellets of a nuclear fuel material in oxide form stacked inside a tubular cladding, generally made of a zirconium alloy. The claddings of fuel rods must hold the nuclear fuel pellets and they constitute the primary barrier preventing the nuclear fuel from spreading inside the reactor.

In the case of local piercing of the cladding of a fuel rod, the reactor cooling water penetrates inside the cladding of the fuel rod; this water, which boils, reacts with the metal of the cladding to form hydrogen that produces hydridation of the metal of the cladding. This may result in further perforations of the cladding which amplify the results of the initial piercing.

It is therefore necessary to reduce to a minimum the risks of piercing of the fuel rod claddings, in particular at the bottom grid of the assemblies, where the rods are subjected to intense transverse hydraulic flows and are therefore susceptible to wear, because of the "fretting" phenomenon, by vibration against the rod supports constituted by the springs and the dimples.

Furthermore, the bottom grid of a nuclear fuel assembly is a location highly susceptible to trapping of debris which is vibrated by the circulating cooling fluid. This vibrating debris can damage the rods by friction and wear.

It has therefore been proposed to protect the fuel rod claddings by a layer of wear-resistant coating, in particular in the zones of the cladding which are most exposed to wear.

It has, for example, been proposed to improve the wear resistance of the fuel rod claddings made of zirconium alloy by depositing a hard coating on the external surface of the claddings, in particular by zirconium oxide (zirconia) deposits, these deposits being capable of guaranteeing some degree of protection against wear by the debris carried by the reactor cooling water.

In FR-A-89-12920, filed by FRAMATOME and COGEMA, a process was proposed for surface oxidation of a part made of a passivatable metal such as zirconium or a zirconium alloy, which makes it possible to produce a diffused layer of zirconium oxide on this part. This process is applicable in particular to coating the external surface of fuel rod claddings for a nuclear reactor.

In the context of this process for surface oxidation of a passivatable metal part, a gas activated by a cold plasma is used, i.e., a gas containing species activated by supply of energy. Using an activated gas makes it possible to obtain an oxide layer composed of fine and homogeneous grains at the surface of the part at moderate temperatures.

This process makes it possible to obtain oxide coating layers which guarantee a high degree of protection against the corrosion of elements such as cladding tubes; however, the layers obtained, being thin, do not guarantee very efficient protection against damage of mechanical origin, due, for example, to friction of debris against the cladding tubes.

It has also been proposed in WO-A-92 09716 to reduce the wear by fretting of zirconium alloy cladding tubes by producing carbide or oxide coatings on the surface of the cladding tubes, by using a gaseous phase or molten salts at a temperature of less than 500° C. It has thus been possible to form protective layers whose thickness may be up to 2 $\mu$m. The layers formed on the surface of the cladding tubes are still too thin to make it possible to guarantee very effective protection against mechanical damage, for example to prevent scratching of the surface of the cladding tubes.

It has also been proposed in U.S. Pat. No. 5,171,520 to produce a local coating of the nuclear fuel rods in those zones most greatly subjected to wear, by spraying ceramic and glass onto the surface to be coated. It is possible in this way to obtain layers with a thickness greater than 100 $\mu$m made of materials such as zircon bound by aluminosilicates, borosilicates or calcioborates.

It has also been proposed in U.S. Pat. No. 5,227,129 to produce the coating for protection against wear and against corrosion from zircon nitrite, on the external surface of the cladding tubes of fuel rods, by an ionic deposition process.

Although the methods of protection by depositing a coating allow a substantial increase in the wear resistance of the cladding tubes of fuel rods, the coatings obtained have the drawback of being layers formed by diffusion of an element, so that the thickness of these layers is limited and high stress gradients are produced in the coated surface layers. If coatings with substantial thickness are produced, these coatings may exhibit defects which lead to corrosion-sensitization of the metal of the substrate in proximity to these defects.

Furthermore, the coating processes which can be used in the case of fuel rods including a zirconium alloy cladding tube must be carried out at a temperature such that the metallographic state of the cladding tube is not altered by the treatment.

In the case of a zirconium alloy which has undergone stress-relieving heat treatment, the treatments must be carried out at a temperature of less than 480° C.

In the case of a zirconium alloy in the recrystallized state, the treatment must be carried out at a temperature of less than 650° C.

Gas-phase chemical coating processes, generally called CVD (chemical vapor deposition) processes, are known which make it possible to produce deposits of different types on a substrate. In order to implement this process, a reactive gas, for example an oxidizing or carburizing gas, is caused to react, at the surface of the substrate to be coated, on a volatile metallic element component, in order to form in vapor phase a compound of the metallic element such as an oxide or carbide which is deposited on the substrate to be coated.

In particular, the metallic element may be the basic metallic element of the material constituting the substrate.

In the case of a zirconium alloy cladding tube, it is possible to deposit, for example, a compound constituted by a zirconium oxide on the zirconium-based alloy substrate.

In order to deposit the coating on the substrate, it is necessary to heat the substrate to a sufficiently high temperature, of the order of 700 to 1100° C.

In the case of a zirconium alloy cladding tube, the temperature of deposition by the CVD process must not exceed the limits fixed by the metallographic structure of the alloy.

CVD deposition processes are known, in which a part of the energy necessary for activating the reaction is supplied by excitation of the reactive gas by a cold plasma. Excitation of the reactive gas makes it possible to create activated chemical species within the gas, which thus has an increased reactivity.

It is thus possible to lower the reaction temperature, which is entirely favorable in the case of certain applications.

Furthermore, there is no known method making it possible to produce a highly adherent coating of a metal oxide layer on a substrate constituted principally by a metal sensitive to attack by halides and hydrogen.

SUMMARY OF THE INVENTION

It is an object of the invention to provide a process for coating a substrate made of a passivatable metal or an alloy based on a passivatable metal, such as zirconium, with a metal oxide layer, this process making it possible to obtain a coating for protecting the substrate against mechanical damage which is perfectly adherent, does not have the risk of accelerating corrosion at any defects and which can be obtained at a moderate temperature compatible with the possibilities for treatment of the substrate.

To this end:

surface preoxidation of the substrate is carried out by bringing the substrate into contact with an oxidizing gas excited in a cold plasma, the substrate being placed in the flowing afterglow of the plasma and heated to an oxidation temperature of less than 500°, and a deposit of metal oxide is produced by oxidation of a metal halide on the substrate placed in the flowing afterglow of the plasma, by bringing the metal halide in gaseous form into contact with a reactive gas mixture including an oxidizing element excited in a cold plasma.

The invention also relates to a zirconium alloy cladding tube of a fuel rod of an assembly of a nuclear reactor and to a spacer grid for holding rods in an assembly, including a protective oxide coating produced by the process according to the invention.

The invention can also be applied to coating the internal surface of guide tubes of neutron absorber rods in a fuel assembly.

Activation by a cold plasma of the reactive species and, in particular, of the oxidizing elements used in the context of the invention makes it possible to decrease the reaction temperature by supplying energy to the reactive species. This activation may take place, in particular, by using a diode or triode plasma, a radio-frequency plasma or a microwave plasma. The working pressure depends on the type of plasma chosen. In order to obtain a good compromise between the requirements relating to the density of the activated species, technological implementation and the flexibility of the process, a 300 to 2450 MHz microwave generator system is preferably used.

Any resonant cavity device may be used to transmit the microwaves to the reactive gas.

Preferably, the gaseous metal halide is formed by reaction of a halogen on a metal in divided form, heated to a determined reaction temperature, during the coating process. Thus, the production of gaseous halide can be controlled as a function of the quantities necessary to coat the substrate.

The substrate is generally arranged in the far flowing afterglow of the cold plasma, i.e., in a zone distant from the plasma activation zone, so as to be swept by the active gas originating from the activation zone. It is thus possible to produce a homogeneous coating on substrates extended in at least one direction, such as long fuel rod cladding tubes. Arranging the substrate in the far afterglow makes it possible to control the activity of the reactive gas, because of the limited lifetime of the activated species.

BRIEF DESCRIPTION OF THE DRAWINGS

In order to explain the invention clearly, a description will now be given by way of example, with reference to the appended drawing figures, of an embodiment of a process according to the invention for coating with a zirconia layer a zirconium alloy cladding tube of a fuel rod for a nuclear reactor.

FIG. 1 is a schematic representation in elevation and in section of an exemplary embodiment of an installation for implementing the coating process according to the invention.

FIG. 1A is a view on a larger scale and in section of the chlorination chamber of the installation represented in FIG. 1.

DESCRIPTION OF PREFERRED EMBODIMENT

The two phases of the coating process according to the invention, i.e., the phase of preoxidizing the zirconium alloy substrate and the subsequent phase of vapor phase deposition of zirconia on the preoxidized substrate are carried out one after the other, by using the device represented in the drawing figure.

The coating device includes a reactor tube 1 inside which a cladding tube 2 of a fuel rod of a pressurized water nuclear reactor is arranged substantially coaxially.

The cladding tube 2 is made of a zirconium alloy such as Zircaloy 4. The cladding tube 2 has a diameter of the order of 10 mm and a length of the order of 4 m.

A part of the tube 2, on which a coating is not produced, may project out of the reactor tube 1.

The reactor tube 1 has an internal diameter substantially greater than the diameter of cladding tube 2 and a length which may be greater than the length of the cladding tube 2 of the fuel rod.

The cladding tube 2 is held inside the reactor tube 1, in an arrangement substantially coaxial with the reactor tube, by means of a tubular support 3 inside which a thermocouple 4 is arranged, making it possible to measure the temperature of the cladding tube 2 during the various phases of the coating process.

The tubular support 3 of the cladding tube 2 is fixed in a central opening of a plate 5 for closing one end of the reactor tube. The plate 5 includes means for releasable and leaktight fastening on the end part of the reactor tube 1, so as to mount the cladding tube 2 in a coaxial arrangement before starting a coating operation.

The end of the reactor tube 1 opposite the plate 5 is closed by a back 6 including a central opening in which a tube 7 having a coaxial arrangement relative to the reactor tube 1 is engaged and supported, by means of which reactive gases can be introduced into the reactor tube 1. The tube 7 is extended by an adaptor 39 which covers one end of the cladding tube 2, so that the reactive gases conveyed by the tube 7 are released into the reactor tube 1 only in the immediate vicinity of the substrate 2.

The reactor tube 1 is surrounded by a furnace 8 having the shape of a sleeve which is engaged on the reactor tube in the zone in which the cladding tube 2 held by the support 3 is arranged.

The sleeve-shaped furnace 8 includes, over a substantial part of its length, electrical resistors 9 embedded in a refractory insulation material 10.

The furnace makes it possible to increase and maintain the temperature of the reactor tube 1, of the gases contained inside the reactor tube and of the cladding tube 2 during the successive phases of a coating operation.

The internal volume of the reactor tube 1, which is connected via a suction pipe 11 and two branched suction pipes 11a and 11b to two vacuum pumps 12a and 12b can be set at a reduced pressure, making it possible to obtain optimum conditions for carrying out the coating operations.

The pump 12a is a primary rigid-rotor vane pump which can create and maintain a level of vacuum in the reactor tube such that the residual pressure of the gases in the reactor tube can be decreased to 0.01 mbar.

The pump 12b is a primary liquid-ring pump which makes it possible to obtain a vacuum such that the residual pressure in the reactor tube can reach a reduced value which may range as far as 1 mbar.

The pump 12a or the pump 12b can be connected to the internal volume of the furnace by opening one of the two valves 13a and 13b placed respectively on the branched pipes 11a and 11b.

A manometer 14 makes it possible to measure the pressure inside the reactor tube 1.

The reactor tube 1 includes an end part, opposite the plate 5, which is connected to a chlorination chamber 15 placed in a lateral arrangement relative to the chamber of the reactor tube 1.

An electrical heating belt 16 is arranged around the part of the reactor tube 1 contained between the chlorinator and the furnace and around the chlorination chamber 15, which electrical heating belt makes it possible to increase the temperature of the reactor tube 1 where the metal halide passes, so as to prevent it from condensing, and of the chlorination chamber 15 and to maintain this temperature at a determined value.

The chlorination chamber 15 has been represented in more detail and in section in FIG. 1A.

The chlorination chamber 15 contains a quartz wool bed 17 on which a layer 18 of zirconium in divided form is deposited, for example zirconium in the form of cuttings or in the form of a sponge.

A reactive-gas feed pipe 19 opens at the upper part of the chlorination chamber 15, which includes an opening 20 at its lower part in order to discharge a volatile zirconium compound formed inside the chlorination chamber 15, by bringing the reactive gases entering through the pipeline 19 into contact with the divided-form zirconium of the layer 18.

The zirconium layer 18 and the quartz wool bed 17 are porous and allow the gases entering the internal volume of the reactor tube 1 to pass through the opening 20.

A thermocouple 21 arranged inside a dip tube makes it possible to acquire the temperature of the divided-form zirconium layer 18 which is brought into contact with the reactive gases.

The pipe 19 is connected at its end opposite the chlorination chamber 15 to a gas distribution panel 22 making it possible to send a perfectly metered gas mixture into the pipeline 19 and the chlorination chamber 15, which mixture includes a halide such as chloride and an inert diluent gas such as argon.

The distribution panel 22 includes a chlorine supply line 23 and an argon supply line 24 which are arranged in parallel and are connected at an outlet end to the end part of the supply pipeline 19, via a T-connector 28 which mixes the chlorine and argon.

Pneumatic shutoff valves 25 and 25' are arranged on the pipeline 19 so as to control the feeding of the reactive gases into the chlorination chamber 15 or, conversely, to interrupt the supply of reactive gas to the chlorination chamber.

Each of the supply lines 23 and 24, which is connected at its end opposite the supply pipe 19 to a gas storage tank, this gas being chlorine in the case of the supply line 23 and argon in the case of the supply line 24, includes a pressure reducer 26 and a flow meter or mass-flow controller 27 which meters the gases consisting of the halogen and the inert gas, in a determined proportion which is exactly as desired.

The supply pipe 19 connected to the mixer 28 makes it possible to send a gas mixture having a perfectly defined composition into the chlorination chamber 15.

The pipe 7 for supplying the chamber of the reactor tube 1 with reactive gas, which pipe is connected at one of its ends to the injection adaptor 39 situated in the reactor tube 1, is connected at its opposite end to a second reactive-gas supply panel 29, via at least two branched supply pipes such as the pipes 30 and 31.

The pipes 30 and 31 are connected together and to the pipe 7 via a T-connector 32 which mixes the gases delivered by the pipes 30 and 31 to produce a reactive gas mixture which is introduced into the internal volume of the reactor tube 1.

Each of the supply pipes such as 30 and 31 is connected at one end to a tank for storing a gas under pressure, which may be either an oxidizing or reducing reactive gas or an inert gas such as argon.

The oxidizing reactive gas may consist of pure oxygen, carbon dioxide $CO_2$, or else steam.

The reducing reactive gas may consist of hydrogen.

On each of the supply pipes such as 30 and 31, a pressure reducer 33 making it possible to lower and control the pressure of the gas delivered by the gas storage tank and a flow meter or mass flow controller 34 making it possible to control the proportion of the different gases in the mixture are arranged on the panel 29 downstream of the tank.

An isolation valve 35 is placed on each of the pipes 30 and 31, upstream of the connector 32.

An isolation valve 36 and a solenoid valve 37 are arranged, at the end of the pipe 7 connected to the connector 32, on the supply pipe 7 connected to the injection adaptor 39 situated in the reactor tube 1. A manometer 38 makes it possible to measure the pressure of the gas mixture exiting the connector 32.

The supply pipe 7 which passes through the excitation structure 40 consisting of a resonant cavity connected by a waveguide to a microwave generator serves as a discharge tube.

The gas mixture exiting the connector 32 passes through the discharge tube 7 which excites the gas mixture by means of the microwaves transmitted to the discharge tube 7 by the excitation structure 40. In the discharge tube 7, the gas mixture is excited by absorption of the energy of the microwaves; because of this, the gas mixture exiting the discharge tube 7 contains excited species. The metastable, electrically neutral activated species react on the substrate 2 in flowing afterglow.

A manometer 41 makes it possible to measure the pressure of the gas mixture at the outlet of the discharge tube connected to the microwave generator.

It is thus possible to make a reactive gas mixture enter the reactor tube, which mixture includes excited species and, in particular, contains oxygen, an inert support gas and, optionally, a reducer such as hydrogen.

A line 45 for supplying inert gas such as argon is furthermore connected directly to the reactor tube 1. A pressure reducer 43, a mass flow meter 44 and a valve 42 are successively placed on the supply line 45 which is connected to an argon tank at its end opposite the reactor tube 1. The line 45 makes it possible to introduce into the reactor tube 1 makeup argon for entraining the gases in the reactor tube 1 at a controlled rate.

The implementation of the installation for producing a zirconia coating on a cladding tube of a nuclear fuel assembly will now be described.

The coating process according to the invention is a process in two phases, which are carried out one after the other on the installation represented in FIGS. 1 and 1A.

The cladding tube 2 is fitted inside the reactor tube 1 on the support 3 which is fixed on the reactor tube 1 by means of the plate 5 attached in leaktight fashion onto the reactor tube 1.

In order to carry out the first phase of the coating process, which is a phase of preoxidizing the external surface of the tube 2 with the aid of a mixture of oxygen and of an inert carrier gas, the vacuum pump 12b is started so as to evacuate the air contained in the reactor tube 1. The valve 13a is closed and the valve 13b is opened. The cladding tube is heated by means of the furnace 8 to a temperature of less than 500° C., which may preferably be between 250 and 480° C.

The pipe 7 is fed with a mixture of oxygen and inert gas such as argon, via pipes 30 and 31 and the mixing connector 32, so that the gas mixture formed enters the injection adaptor 39 situated in the reactor tube 1 which is under reduced pressure.

The respective flow rates of argon and oxygen are controlled by means of flow meters 34.

The gas mixture passes through the discharge tube 7 and the excitation structure 40 which is connected by a waveguide to the microwave generator supplied to produce microwaves at a frequency of 2450 MHz and which transmits an energy to the gas mixture of argon and oxygen. The mixture introduced into the reactor tube 1 via the injection adaptor 39 is thus excited, so that an oxidized layer is rapidly obtained on the surface of the cladding tube, at a relatively low temperature.

The gas mixture used for the preoxidation is introduced into the reactor tube 1 at a reduced pressure of between 1 and 100 mbar. Under these conditions, the preoxidized layer may reach a thickness of 0.1 to 1 $\mu$m in a time of one hour, depending on the temperature of the substrate and of the reactive gas and the pressure of the reactive gas.

The preoxide layer produced is highly adherent, has very low porosity and gives sufficient coverage to protect the zirconium alloy substrate during the subsequent phases of the coating process and use of the fuel rod.

A preoxidation temperature of 460° C. and a mixture of argon and oxygen including 1% by volume of oxygen are preferably used.

The second phase of the process, which consists in producing a zirconia deposit on the preoxidized surface can be carried out immediately after the preoxidation phase, or after a delay.

It may be advantageous to carry out the zirconia deposition phase immediately after the preoxidation phase, in so far as the substrate constituted by the cladding tube can be kept at the temperature reached during the preoxidation phase.

In order to carry out the gas-phase chemical deposition of zirconia onto the preoxidized surface of the cladding tube 2, a reactive gas is introduced into the chlorination chamber 15 which contains a layer 18 of zirconium in divided form, which gas consists of a mixture of chlorine and argon originating from the distribution panel 22, via the supply pipe 19.

The layer 18 of zirconium in divided form is heated to a reaction temperature of between 160 and 350° C. The gas mixture of argon and chlorine is introduced into the chlorination chamber 15 so as to come into contact with the zirconium in divided form constituting the layer 18.

In contact with the chlorine, the zirconium is converted into zirconium chloride $ZrCl_4$ according to the reaction: $2Cl_2+Zr \rightarrow ZrCl_4$.

The mixture of chlorine and argon is preferably introduced into the chlorination chamber 15 at a temperature of 300° C. and at a pressure of 20 mbar.

The zirconium chloride $ZrCl_4$ obtained in gaseous form passes through the quartz wool bed 17 to enter the chamber of the reactor tube 1.

Inside the chamber of the reactor tube 1, the zirconium chloride $ZrCl_4$ is oxidized into zirconia $ZrO_2$ by using a reactive mixture including at least an oxidizing gas and an inert gas, and preferably an oxidizing gas, a reducing gas and an inert gas.

The reactive gas mixture is excited in the discharge tube 7 by the energy of the microwaves which are produced by the microwave generator and are transferred to the excitation structure 40.

The gaseous zirconium chloride delivered at the outlet of the chlorination chamber 15 is kept separate from the oxidizing mixture originating from the plasma, by virtue of the quartz injection tube 39, so as to prevent it from reacting in homogeneous phase and from being totally consumed before having reached the substrate. Mixing of the gaseous chloride and the activated oxidizing gas therefore takes place only in the most direct proximity to the substrate 2.

This separation furthermore makes it possible to transport the gases over a distance such that positioning the substrate in near afterglow is avoided.

Because of the absence of electrons or ions in the gas mixture and the requirement of treating long parts, it is necessary to employ the far afterglow. Furthermore, the possibility of choosing the discharge/reaction-zone distance makes it possible to adapt the reactivity of the gas mixture and therefore, for example, to favor control of the reaction by a chemical or diffusion regime. Finally, this configuration makes it possible to avoid the flow problems which might make it necessary to add a supplementary activation source, such as an ion beam.

The reactive gases are at a reaction temperature of between 250 and 500° C. The pressure of these gases is between 1 and 100 mbar.

A reactive gas mixture containing oxygen, hydrogen and argon is preferably used.

Such an activated mixture, coming into contact with the zirconium chloride $ZrCl_4$ in gaseous form, produces oxidation of the chloride, which is converted into zirconia and liberates the element chlorine.

Adhesion of the zirconia layer is facilitated by the presence of a preoxidized layer on the surface of the cladding tube. In fact, the gas-impermeable preoxidized layer counteracts attack of the metal of the substrate by the hydrogen and the chlorides or the chlorine which is produced. The hydrogen and the chlorine tend to combine and be eliminated in the form of compounds such as HCl in the gases taken in by the pump at the outlet of the reactor tube.

The zirconium tetrachloride $ZrCl_4$ is oxidized by the excited species in the $O_2$—$H_2$—Ar mixture which are present in the afterglow.

This oxidation can be carried out at a moderate temperature, for example between 250 and 500° C. or, more specifically, between 300 and 480° C. The growth rate of the zirconia layer may exceed 30 $\mu$m/h.

It has also been proposed to use ternary mixtures including an oxidizing element other than pure oxygen and, for example, an oxidizing element consisting of carbon dioxide $CO_2$.

The zirconia deposits obtained by the process of the invention are highly adherent and may reach relatively high thicknesses of the order of 20 to 60 $\mu$m with treatment times limited to two hours.

The zirconia deposited has a monoclinic crystallographic structure.

Scratch tests were carried out on the zirconia coating deposited on a Zircaloy 4 tube. These tests showed that the coating exhibits a ductile nature during the scratch tests, which may be attributed to a column structure of the coatings produced.

The coatings produced can provide efficient protection for the zirconium alloy cladding tubes against mechanical attack such as scratching or wear.

The invention is not limited to the embodiments which have been described.

Thus, the preoxidized layer and the zirconia deposit may be produced in a manner other than that which has been described, starting with excited gas mixtures other than those which have been indicated.

The zirconia may be deposited from a zirconium halide other than a chloride.

The invention also applies to the protection of passivatable metals other than zirconium and its alloys and, for example, to the protection of hafnium.

The device used for carrying out the two successive coating phases may have characteristics other than those which have been described.

The means for heating the substrate and the gases used may be different from the electrical heating means which have been described.

The means for distributing the gases may also be different.

The reactor in which the substrate to be coated is arranged may have a shape other than a tubular shape, this shape being adapted to the shape of the part to be coated.

In order to render more homogeneous the zirconia deposit on the external surface of a tube, it is possible to rotate the tube about its axis inside the reactor during the vapor phase deposition of the protective oxide.

The process according to the invention applies not only to coating cladding tubes for nuclear fuel rods but also to other nuclear fuel assembly elements generally made of a passivatable metal such as zirconium and its alloys.

In particular, the process according to the invention can be used to produce a wear-resistant and scratch-resistant coating on zirconium alloy fuel assembly grids.

A particular application of the invention relates to the production of wear-resistant coatings inside fuel assembly guide tubes which guide neutron absorber rods in the rod clusters for controlling the reactivity of the core of the nuclear reactor. This limits the risks of wear resulting from vibrations of the end parts of the neutron absorber rods of the control clusters, in particular when the cluster is in the retracted position, so that the lower end parts of the neutron absorber rods vibrate in the upper part of the cluster guide tubes. The coating produced may cover all or part of the inner surface of the guide tube.

We claim:

1. A process for coating a substrate made of zirconium or an alloy based on zirconium, with a metal oxide layer, said process comprising the steps of:
   (a) carrying out surface preoxidation of the substrate by bringing the substrate into contact with an oxidizing gas excited in a cold plasma, said substrate being placed in the flowing afterglow of the plasma and heated to an oxidation temperature of less than 500° C., and
   (b) producing a deposit of metal oxide by oxidation of a metal halide on the substrate placed in the flowing afterglow of the plasma, by bringing the metal halide in gaseous form into contact with a reactive gas mixture including an oxidizing element excited in a cold plasma.

2. The process according to claim 1, wherein the gaseous metal halide is formed by reaction of a halogen on a metal in divided form, heated to a determined reaction temperature.

3. The process according to claim 1, wherein the substrate is arranged in the far flowing afterglow of the cold plasma.

4. The process according to claim 1, wherein the cold plasma is produced by microwaves.

5. The process according to claim 1, wherein the gas mixture for oxidizing the halide includes an oxidizing component, a reducing component and an inert gas.

6. The process according to claim 5, wherein the oxidizing component consists of pure oxygen, the reducing component consists of hydrogen and the inert gas consists of argon.

7. The process according to claim 6, wherein the substrate and the gas mixture for oxidizing the halide are heated to a reaction temperature of between 250 and 500° C.

8. The process according to claim 1 wherein, during the preoxidation phase, the oxidizing gas brought into contact with the substrate consists of oxygen mixed with argon.

9. The process according to claim 8, wherein the temperature of the substrate and of the oxidizing gas during the preoxidation phase is between 250 and 500° C.

10. The process according to claim 1, wherein the substrate consists of a zirconium alloy and the oxide deposited on the substrate consists of zirconia $ZrO_2$.

11. The process according to claim 2, wherein a gas containing chlorine is reacted on zirconium which is in divided form and which is heated to a temperature between 160 and 350° C., in order to obtain zirconium tetrachloride $ZrCl_4$ in gaseous form.

12. The process according to claim 11, wherein the gas containing chlorine is a mixture of chlorine and argon and the temperature of the zirconium in divided form and of the gas mixture is about 300° C.

13. A cladding tube of a fuel rod of an assembly of a nuclear reactor, made of zirconium alloy and comprising a protective coating made by surface preoxidation of a substrate made of zirconium or an alloy based on zirconium, and a deposit of metal oxide produced by oxidation of a metal halide on said substrate in a flowing afterglow of a cold plasma.

14. A spacer grid for a fuel assembly of a nuclear reactor, including a protective coating made of zirconium substrate or a zirconium-based alloy, and a deposit of metal oxide produced by oxidation of a metal halide on said substrate in a flowing afterglow of a cold plasma.

15. A guide tube for a fuel assembly of a nuclear reactor, including over at least part of an internal surface of said guide tube a protective coating made of zirconium substrate or a zirconium-based alloy, and a deposit of metal oxide produced by oxidation of a metal halide on said substrate in a flowing afterglow of a cold plasma.

* * * * *

UNITED STATES PATENT AND TRADEMARK OFFICE
CERTIFICATE OF CORRECTION

PATENT NO. : 6,033,493
DATED : March 7, 2000
INVENTOR(S) : Dominique Hertz, et al.

It is certified that error appears in the above-indentified patent and that said Letters Patent is hereby corrected as shown below:

ON THE TITLE PAGE

Item [73]  Change to read:  Assignees:  Framatome, Courbevoie; Cogema, Velizy-Villacoublay, both of France".

Signed and Sealed this

Twenty-seventh Day of March, 2001

Attest:

NICHOLAS P. GODICI

Attesting Officer

Acting Director of the United States Patent and Trademark Office